(12) United States Patent
Sato et al.

(10) Patent No.: US 9,136,443 B2
(45) Date of Patent: Sep. 15, 2015

(54) DISPLAY DEVICE AND MANUFACTURING METHOD OF THE SAME

(71) Applicant: Japan Display Inc., Tokyo (JP)

(72) Inventors: Toshihiro Sato, Mobara (JP); Hironori Toyoda, Chiba (JP)

(73) Assignee: JAPAN DISPLAY INC., Tokyo (JP)

( * ) Notice: Subject to any disclaimer, the term of this patent is extended or adjusted under 35 U.S.C. 154(b) by 188 days.

(21) Appl. No.: 13/950,319

(22) Filed: Jul. 25, 2013

(65) Prior Publication Data

US 2014/0027798 A1    Jan. 30, 2014

(30) Foreign Application Priority Data

Jul. 26, 2012    (JP) ................................ 2012-166264

(51) Int. Cl.
| | |
|---|---|
| H01L 33/50 | (2010.01) |
| H01L 33/44 | (2010.01) |
| G02B 5/20 | (2006.01) |
| H01L 51/52 | (2006.01) |

(52) U.S. Cl.
CPC ............... *H01L 33/50* (2013.01); *G02B 5/201* (2013.01); *H01L 33/44* (2013.01); *H01L 51/5284* (2013.01)

(58) Field of Classification Search
CPC ..... H01L 33/44; H01L 33/50; G02F 1/13394; G02F 1/136209
See application file for complete search history.

(56) References Cited

U.S. PATENT DOCUMENTS

| | | | |
|---|---|---|---|
| 2006/0061719 A1* | 3/2006 | Tomioka et al. | 349/123 |
| 2007/0176548 A1* | 8/2007 | Kim et al. | 313/512 |
| 2008/0007296 A1* | 1/2008 | Umezaki | 326/62 |
| 2010/0301742 A1* | 12/2010 | Moriwaki | 313/504 |
| 2011/0080547 A1* | 4/2011 | Matsumori et al. | 349/124 |
| 2012/0057111 A1* | 3/2012 | Ohkubo et al. | 349/106 |
| 2012/0088040 A1* | 4/2012 | Matsumori et al. | 428/1.26 |
| 2012/0314148 A1* | 12/2012 | Yamaguchi et al. | 349/42 |
| 2013/0009321 A1* | 1/2013 | Kagawa et al. | 257/774 |
| 2013/0135547 A1* | 5/2013 | Hibayashi et al. | 349/33 |
| 2013/0334402 A1* | 12/2013 | Izuha et al. | 250/208.1 |
| 2013/0341694 A1* | 12/2013 | Maekawa et al. | 257/294 |

(Continued)

FOREIGN PATENT DOCUMENTS

| | | |
|---|---|---|
| JP | 2002-299044 | 10/2002 |
| JP | 2007-220395 | 8/2007 |

(Continued)

OTHER PUBLICATIONS

Korean office action of Appln. No. 10-2013-0087670 dated Jul. 25, 2014 with partial English translation.

*Primary Examiner* — Joseph C Nicely
(74) *Attorney, Agent, or Firm* — Lowe Hauptman & Ham, LLP

(57) ABSTRACT

Damage of a color filter due to erosion or the like in a process of patterning a light-shielding film to form a black matrix laminated on the color filter of a display device is prevented. Plural color filters are formed on a second substrate correspondingly to pixels. Protection films laminated on upper surfaces of the respective color filters are formed. A light-shielding film is laminated on a surface of the second substrate on which the protection films are formed. The light-shielding film is processed while the protection films are used as damage stoppers, and light-shielding members made of the light-shielding film selectively left along boundaries of the pixels are formed.

6 Claims, 7 Drawing Sheets

(56) References Cited

U.S. PATENT DOCUMENTS

2014/0111748 A1* 4/2014 Nakamura et al. ............ 349/108
2015/0090987 A1* 4/2015 Uetake ............................ 257/40

FOREIGN PATENT DOCUMENTS

JP        2009-104969        5/2009
KR    10-2007-0120234 A    12/2007

* cited by examiner

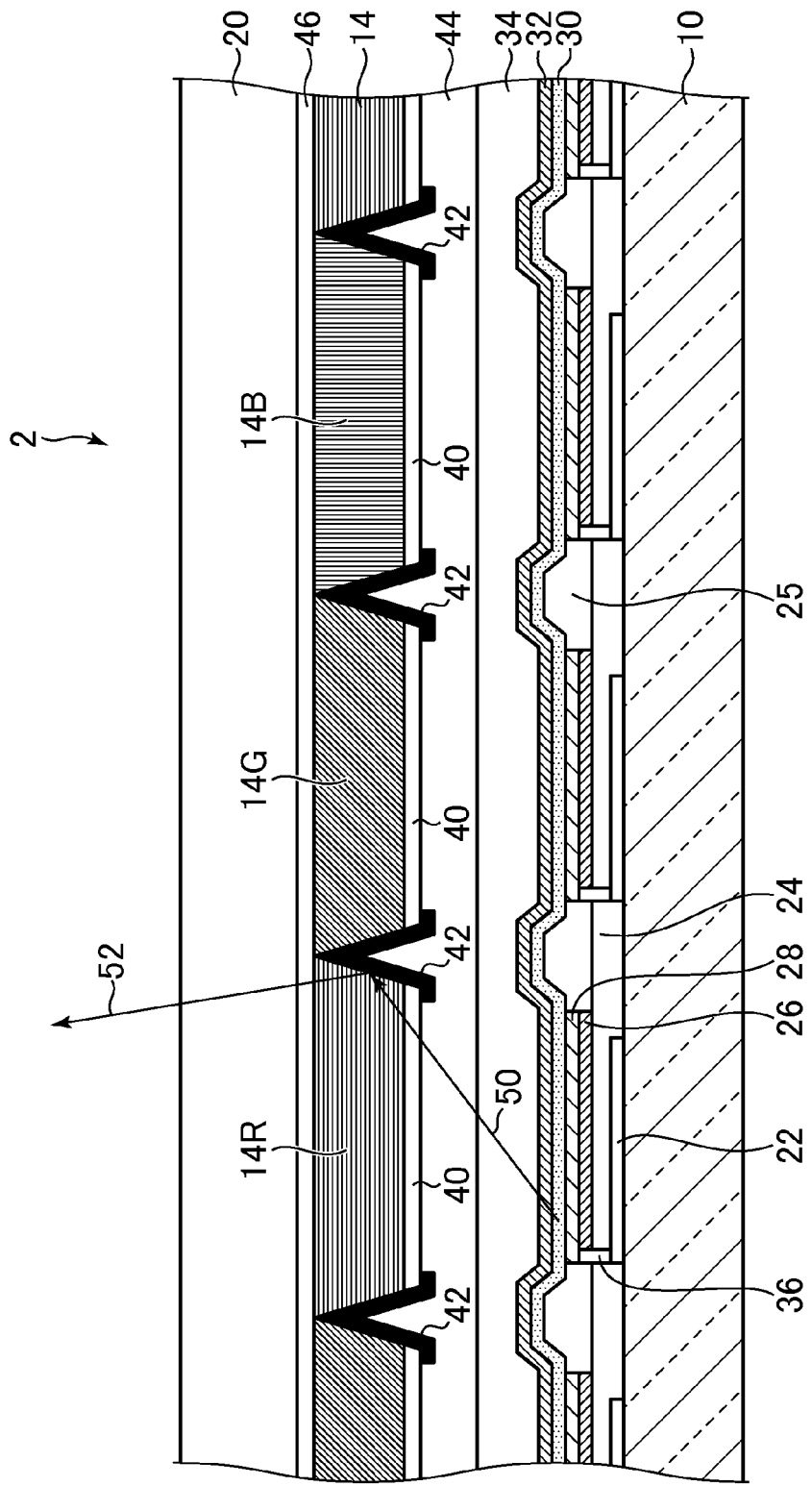

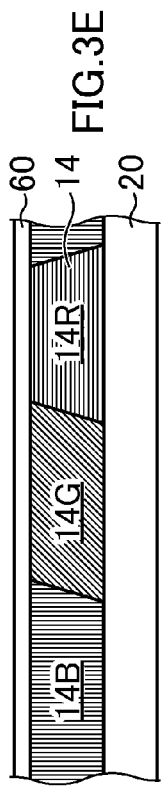
FIG.3A
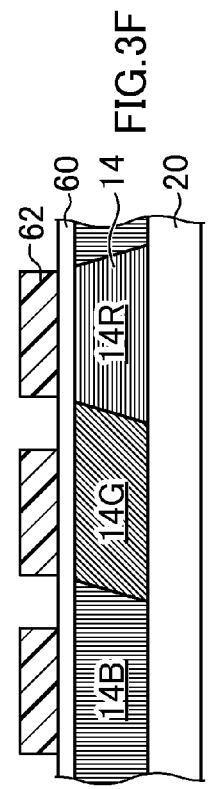
FIG.3B
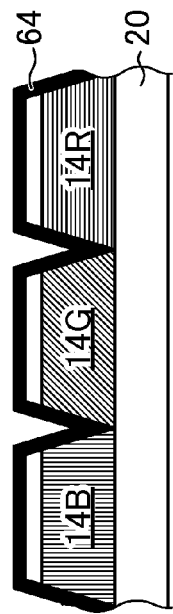
FIG.3C
FIG.3D
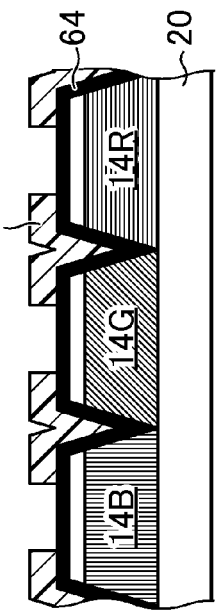
FIG.3E
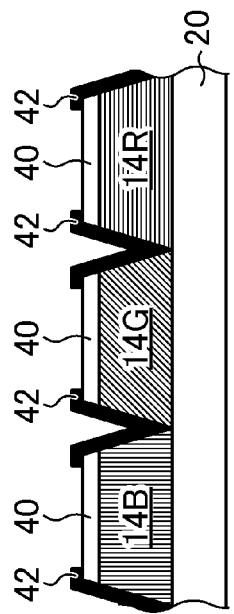
FIG.3F
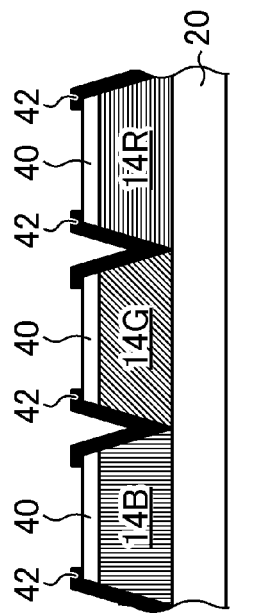
FIG.3G
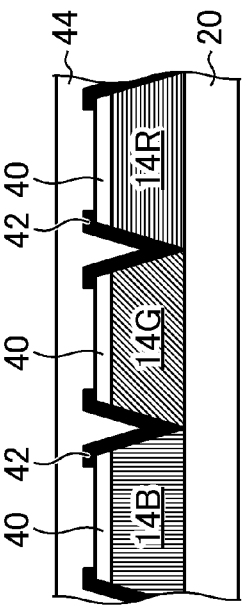
FIG.3H

DISPLAY DEVICE AND MANUFACTURING METHOD OF THE SAME

CROSS-REFERENCE TO RELATED APPLICATION

The present application claims priority from Japanese application JP 2012-166264 filed on Jul. 26, 2012, the content of which is hereby incorporated by reference into this application.

BACKGROUND OF THE INVENTION

1. Field of the Invention

The present invention relates to a display device using electroluminescence and a manufacturing method of the same.

2. Description of the Prior Art(s)

An OLED (Organic Light Emitting Diode), that is, an organic EL (Electro Luminescent) element attracts attention as a thin and light-weight light-emitting source, and an image display device including many organic EL elements is developed. The organic EL element has a structure in which at least one layer made of an organic material is sandwiched between a pixel electrode and an opposite electrode.

An image display device using electroluminescence typically includes an element substrate on which organic EL elements are arranged in a matrix form correspondingly to pixels and an opposite substrate disposed to be opposite to the element substrate. A structure including color filters arranged in a matrix form correspondingly to the pixels is formed on the opposite substrate. A light emitted from the organic EL element is directed from the element substrate to the opposite substrate, passes through the color filter and outgoes. A black matrix to prevent lights from adjacent organic EL elements from being mixed is normally provided at boundaries of the color filters.

The color filter is made of a resin material having light selective transparency, or the like. The black matrix is formed by using, for example, a photolithography technique to pattern a light shielding film laminated under or on the color filter. That is, the black matrix is selectively formed at the pixel boundary by a patterning process of, for example, etching the light shielding film to remove it from an area other than the pixel boundary. The light shielding film is made of, for example, a metal material such as chromium (Cr).

SUMMARY OF THE INVENTION

When the black matrix is formed on the color filter, there is a problem that the etching process for patterning a light-shielding film, which becomes the black matrix, can also erode the color filter. In the etching process, although an etching time and the like are controlled so as to suppress the etching amount of the color filter, it is difficult to completely prevent erosion of the color filter. The erosion causes, for example, irregularity in thickness of the color filter, and there is a fear that the picture quality of the display device is reduced. An evaporation method such as CVD (Chemical Vapor Deposition) can selectively form the black matrix by using a mask. However, there is a fear that the color filter is damaged by the influence of plasma used in the evaporation method and light transmissive performance is degraded.

The invention is made to solve the above problems, and provides a display device in which damage of a color filter due to erosion or the like in a patterning process of a light-shielding film is prevented and picture quality degradation is prevented.

(1) According to an aspect of the invention, a display device includes a first substrate on which a light-emitting element is disposed correspondingly to each of plural pixels, and a second substrate on which a color filter is disposed correspondingly to each of the plural pixels and which is bonded to the first substrate, the second substrate is provided with a protection film laminated on the color filter, and a light-shielding member which is laminated on the protection film and is disposed along a boundary of each of the pixels, the color filter is provided with a separation groove along the boundary of the pixel to separate the color filters, and the light-shielding member covers an inner surface of the separation groove and a part of an upper surface of the color filter.

(2) In the display device recited in (1), the separation groove may separate the plural color filters and the protection films along the boundary of the pixel, and the light-shielding member may cover the inner surface of the separation groove and a peripheral part of the upper surface of the color filter.

(3) In the display device recited in (2), the protection film may be selectively disposed on the upper surface of the color filter, and the light-shielding member may have an overlap with the protection film at the peripheral part.

(4) In the display device recited in (2), an arrangement of the pixels may include a non-filter pixel in which the color filter is not disposed on the second substrate, and the light-shielding member may cover a side surface and an edge part of the upper surface of the color filter at a portion in contact with the non-filter pixel among the boundaries of the pixels.

(5) In the display device recited in (1), the first substrate may be provided with a pixel separation area to separate the plural light-emitting elements from each other, and the light-shielding member may have a plane shape corresponding to the pixel separation area.

(6) In the display device recited in (1), the light-shielding member which is formed by patterning a light-shielding film laminated on the protection film, and the protection film may be made of a material resistant to a process of patterning the light-shielding film.

(7) According to an another aspect of the invention, a manufacturing method of a display device includes a light-emitting element forming step of forming a light-emitting element on a first substrate correspondingly to each of plural pixels, a color filter forming step of forming a color filter on a second substrate correspondingly to each of the plural pixels, a protection film laminating step of laminating a protection film on the color filter, a light-shielding film laminating step of laminating a light-shielding film on the protection film, a light-shielding member forming step of patterning the light-shielding film while protecting the color filter by the protection film and forming a light-shielding member made of the light-shielding film selectively left along a boundary of each of the pixels, and a bonding step of facing and bonding the first substrate after the light-emitting element forming step and the second substrate after the light-shielding member forming step.

(8) The manufacturing method of the display device recited in (7) may further include, between the protection film laminating step and the light-shielding film laminating step, a separation groove forming step of removing the protection film and the color filter by an etching process from an area along the boundary of the pixel and forming a separation groove to separate the color filters, and the light-shielding member forming step may form the light-shielding member which has an overlap with a peripheral part of the protection film selectively left on an upper surface of the color filter in the separation groove forming step and covers an inner surface of the separation groove.

(9) In the manufacturing method of the display device recited in (7), the color filter forming step may include a separation groove forming step of forming a separation groove to separate the color filters by an etching process to remove the color filter from an area along the boundary of the pixel, and the light-shielding member forming step may form the light-shielding member which covers an inner surface of the separation groove after lamination of the protection film and has an overlap with the protection film at a peripheral part of an upper surface of the color filter.

(10) In the manufacturing method of the display device recited in (8) or (9), the display device may include a non-filter pixel in which the color filter is not disposed on the second substrate in an arrangement of the pixels, and the light-shielding member forming step may form the light-shielding member covering a side surface and an edge part of the upper surface of the color filter at a portion in contact with the non-filter pixel among boundaries of the pixels.

(11) In the manufacturing method of the display device recited in (7), the light-emitting element forming step may provide a pixel separation area between the plural light-emitting elements to separate the plural light-emitting elements from each other, and the light-shielding member forming step may form the light-shielding member having a plane shape corresponding to the pixel separation area.

(12) According to another aspect of the invention, a display device includes a first substrate on which a light-emitting element is disposed correspondingly to each of plural pixels, a color filter disposed on the first substrate correspondingly to each of the plural pixels, a protection film laminated on the color filter, and a light-shielding member which is laminated on the protection film and is disposed along a boundary of each of the pixels, the color filter is provided with a separation groove along the boundary of the pixel to separate the color filters, and the light-shielding member covers an inner surface of the separation groove and a part of an upper surface of the color filter.

(13) In the display device recited in (12), the separation groove may separate the plural color filters and the protection films along the boundary of the pixel, and the light-shielding member may cover the inner surface of the separation groove and a peripheral part of the upper surface of the color filter.

(14) In the display device recited in (13), the protection film may be selectively disposed on the upper surface of the color filter, and the light-shielding member may have an overlap with the protection film at the peripheral part.

(15) In the display device recited in (12), the light-shielding member which is formed by patterning a light-shielding film laminated on the protection film, and the protection film may be made of a material resistant to a process of patterning the light-shielding film.

BRIEF DESCRIPTION OF THE DRAWINGS

FIG. 2 is a schematic vertical sectional view of the display device of the first embodiment of the invention along line II-II shown in FIG. 1.

FIGS. 3A to 3H are schematic vertical sectional views of main manufacturing steps of a second substrate of the display device of the first embodiment of the invention.

DESCRIPTION OF THE PREFERRED EMBODIMENT(S)

Hereinafter, a mode of carrying out the invention (hereinafter referred to an embodiment) will be described with reference to the drawings.

First Embodiment

Figure 1:
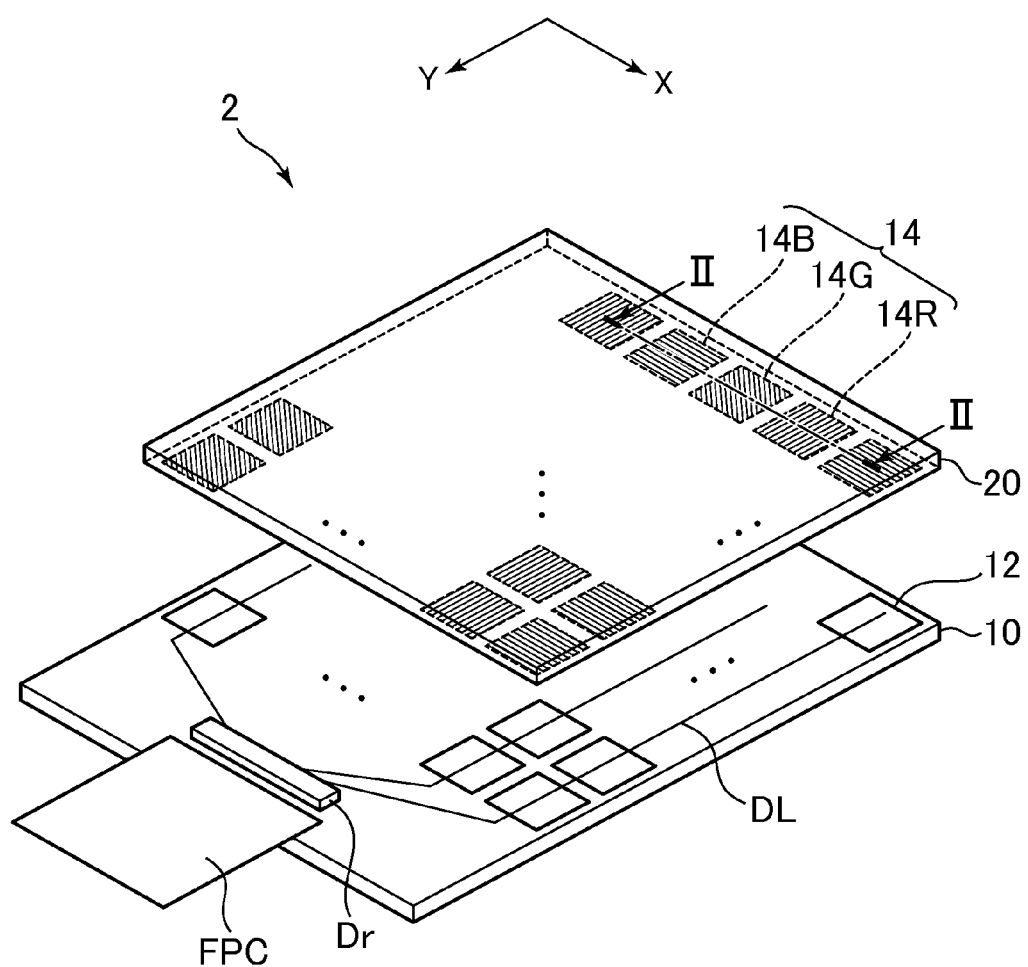
FIG. 1 is a schematic perspective view of a display device of a first embodiment of the invention.

FIG. 1 is a schematic perspective view of a display device 2 of a first embodiment, and FIG. 2 is a schematic vertical sectional view of the display device 2 along line II-II shown in FIG. 1.

The display device 2 is an organic EL display, and includes plural organic EL elements (light-emitting elements) 12 formed on a first substrate 10. The display device 2 has a structure in which the first substrate 10 formed with a lamination structure including the organic EL elements 12 is bonded to a second substrate 20 formed with a lamination structure including color filters 14. The display device 2 of this embodiment displays a color image, and a pixel in the color image includes plural sub-pixels representing colors different from each other, such as, for example, red (R), green (G) and blue (B). In the display device 2, the sub-pixel is a unit in structure, and the organic EL element 12 and the color filter 14 are formed for each sub-pixel. In the following description, the sub-pixel is basically treated as a pixel.

A driving circuit chip Dr is disposed on the first substrate 10. Besides, a flexible printed circuit FPC is connected to the first substrate 10. The first substrate 10 is larger than the second substrate 20, and the driving circuit chip Dr is disposed on the first substrate 10 at a position where the first substrate does not overlap with the second substrate. The driving circuit chip Dr is connected to the flexible printed circuit FPC. The driving circuit chip Dr is supplied with image data through the flexible printed circuit FPC from the outside of the display device 2, and supplies a display signal to each pixel through a data line DL formed on the first substrate 10. Each pixel includes a pixel circuit, the pixel circuit is supplied with a selection signal through a not-shown scanning line, and the selected pixel emits light based on the display signal.

The lamination structure on the first substrate 10 includes a pixel circuit 22, an insulating film 24, a reflecting layer 26, a pixel electrode 28, a light-emitting function layer 30, an opposite electrode 32 and a filler 34.

The pixel circuit 22 is an electronic circuit for feeding electric power to the organic EL element 12 to cause light emission, includes a circuit element such as a thin film transistor (TFT), and is formed on the surface of the first substrate 10.

The insulating film 24 is laminated on the surface of the first substrate 10 so as to cover the pixel circuit 22, and electrically insulates between the pixel circuits 22 provided for the respective pixels, between the reflecting layer 26 and the pixel circuit 22, and the like. The insulating film 24 is formed of, for example, SiO$_2$ or SiN.

The reflecting layer 26 is formed on the insulating film 24. The reflecting layer 26 is provided in order to reflect light emitted from the light-emitting function layer 30 toward an image display side, that is, toward the second substrate 20. Thus, the reflecting layer 26 is preferably formed of a material having high light reflectivity, and for example, aluminum or silver can be used as the material.

The organic EL element 12 includes the pixel electrode 28, the light-emitting function layer 30 and the opposite electrode 32. The pixel electrodes 28 are arranged in a matrix form correspondingly to the pixels. The pixel electrode 28 is laminated on the reflecting layer 26. The pixel electrode 28 is electrically connected to the pixel circuit 22 through a contact hole 36, and injects a drive current supplied from the pixel circuit 22 into the light-emitting function layer 30. The pixel electrode 28 is made of a material having translucency and conductivity, such as, for example, ITO (Indium Tin Oxide). A bank layer 25 is formed between the respective pixel electrodes 28, and the bank layer 25 prevents contact between the adjacent pixel electrodes 28. Besides, the existence of the bank layer 25 prevents direct contact between the pixel electrode 28 and the opposite electrode 32. Especially, when the light-emitting function layer 30 is formed for each pixel, the bank layer covers a peripheral part of the pixel electrode 28, so that leakage current between the end of the pixel electrode 28 and the opposite electrode 32 can be prevented.

The light-emitting function layer 30 is disposed on the pixel electrode 28. The light-emitting function layer 30 includes at least an organic light-emitting layer, and the organic light-emitting layer includes an organic EL material which emits light by combination of a hole and an electron. In this embodiment, the light-emitting function layer 30 emits white light.

The opposite electrode 32 is formed on the light-emitting function layer 30. The opposite electrode 32 is a common electrode commonly in contact with the light-emitting function layer 30 of the plural organic EL elements 12. The opposite electrode 32 is made of a material having translucency and conductivity, such as, for example, ITO.

The filler 34 is laminated on the opposite electrode 32 so as to cover the whole surface of the first substrate 10. The filler 34 is, for example, epoxy resin.

The second substrate 20 is positioned on the image display surface side, and is required to allow the light emitted from the organic EL element 12 to pass through. Thus, the second substrate 20 is made of a translucent material such as, for example, glass, quartz or plastic. On the other hand, the first substrate 10 is positioned on the back surface side of the display device 2, and is not required to have translucency.

The lamination structure on the second substrate 20 includes the color filter 14, a protection film 40, a light-shielding member 42 and an overcoat layer 44.

The color filter 14 is laminated on the surface of the second substrate 20. In this embodiment, the color filter 14 is laminated on the surface of the second substrate 20 with an underlayer 46 interposed. The color filter 14 is made of a translucent resin material or the like, and is colored with a pigment or the like into plural colors. For example, in this embodiment, the color filter 14 includes a red (R) filter 14R, a green (G) filter 14G and a blue (B) filter 14B. The color filters 14 are arranged in a matric form correspondingly to the pixels.

In this embodiment, the color filters 14 have a stripe arrangement. The filters 14R, 14G and 14B of the respective colors are periodically arranged in a direction (x direction) along the section shown in FIG. 2, and the color filters 14 of the same color are arranged in a line in a direction (y direction) orthogonal to the section.

The protection film 40 is laminated on the color filter 14. When the light-shielding member 42 is formed by using a photolithography technique to pattern a light-shielding film laminated subsequently to the protection film 40, the protection film 40 protects the color filter 14 against the etching process of the light-shielding film. For this purpose, the protection film 40 is formed of a material having a small etching rate for the etching process of the light-shielding film. Besides, the thickness of the protection film 40 is set so that a hole is not formed in the protection film 40 even if the light-shielding film is over-etched to remove an etching residual.

Separation grooves 48 to separate the color filters 14 along boundaries of the pixels are formed in the color filter 14 and the protection film 40. In this embodiment, the protection film 40 is not laminated on the inner surface of the separation groove 48, and the protection film 40 is selectively disposed on the surface of the color filter 14. Incidentally, in each of the pixels, light emitted by the organic EL element 12 is incident on the color filter 14 through an opening in which the light-shielding film is removed. The opening has a shape included within the plane shape of the surface of the color filter 14, and the protection film 40 laminated at the position of the opening is formed of a material having transparency. For example, the light-shielding film is formed of a metal such as Cr, and the protection film 40 is formed of SiO$_2$, SiO or SiN which is a material functioning as a stopper against the etching of the light-shielding film and having light transparency.

The light-shielding member 42 is formed by patterning the light-shielding film. The light-shielding film is laminated on the second substrate 20 on which the color filter 14, the protection film 40 and the separation groove 48 are formed. The light-shielding member 42 covers the inner surface of the separation groove 48 and a peripheral part of the protection film 40 laminated on the surface of the color filter 14. That is, the peripheral part of the protection film 40 has an overlap with the light-shielding member 42. On the other hand, the opening of the light-shielding member 42 is provided in the inside area of the protection film 40.

The overcoat layer 44 covers the surface of the second substrate 20 on which the color filter 14, the protection film 40 and the light-shielding member 42 are laminated. The overcoat layer 44 is formed of a transparent resin material such as acrylic resin.

The first substrate 10 and the second substrate 20 on each of which the lamination structure is formed are bonded and integrated while the respective lamination structures face each other.

The light-shielding member 42 prevents light emitted from each of the organic EL elements 12 from being incident on the color filter 14 of the adjacent pixel, and suppresses deterioration in viewing angle characteristic due to color mixing or the like. Specifically, the light-shielding member 42 suppresses leakage of light into the adjacent pixel according to the width of the light-shielding member 42 between the color filters 14. Further, the light-shielding member 42 of this embodiment enters the separation groove 48, and more suitably suppresses the leakage of light into the adjacent pixel. The effect of suppressing the light leakage by the light-shielding member 42 in the separation groove 48 basically becomes high as the separation groove 48 becomes deep and the light-shielding member 42 deeply enters the separation groove 48. Then, in this embodiment, the separation groove 48 has the depth comparable to the thickness of the color filter 14, and the light-shielding member 42 enters the bottom of the separation groove 48, so that the effect of suppressing the light leakage is increased. Besides, since the light-shielding member 42 is formed in the separation groove 48, even if the width of the light-shielding member 42 in the plane shape is reduced, the effect of suppressing the light leakage can be secured. That is, the area of the opening of the light-shielding member 42 is increased and the brightness can be improved.

Besides, in this embodiment, the vertical section of the separation groove 48 is formed in a V-shape. By this, the light-shielding member 42 forms a surface directed in an obliquely forward direction in the separation groove 48. A light 50 incident on the surface from the organic EL element 12 is prevented from being incident on the adjacent color filter 14 by the light-shielding member 42, and is reflected forward by the light-shielding member 42 to become a display light 52. Thus, the color mixing is prevented and the brightness is improved.

FIGS. 3A to 3H are views showing a rough process flow for explaining a manufacturing method of the display device 2, and FIGS. 3A to 3H are respectively schematic vertical sectional views in principal manufacturing steps of the lamination structure of the second substrate 20. The vertical sectional views correspond to the section along line II-II of FIG. 1. Incidentally, in FIGS. 3A to 3H, the lamination structure of the second substrate 20 is represented upside down relative to that shown in FIG. 2.

The color filters 14 of the respective colors are sequentially formed on the surface of the second substrate 20. For example, a red filter film is laminated on the second substrate 20, and this is patterned by a photolithography technique to form an R filter 14R. Next, a green filter film is laminated on the second substrate 20, and this is patterned to form a G filter 14G. Similarly, a blue filter film is laminated and patterned to form a B filter 14B. Incidentally, in FIGS. 3A to 3H, the underlayer 46 is omitted. After the color filters 14 of the respective colors are formed, a protection film 60 is formed on the surface (FIG. 3A).

Next, a photoresist is applied to the surface of the protection film 60 and is patterned by an exposure and development process, so that a photoresist film 62 in which an opening is formed along a pixel boundary is formed (FIG. 3B).

The photoresist film 62 is used as a mask, and the protection film 60 and the color filter 14 are etched, so that a separation groove 48 is formed along the pixel boundary (FIG. 3C). A portion of the protection film 60 remaining on the color filter 14 is the protection film 40 selectively disposed on the upper surface of the color filter 14 shown in FIG. 2.

After the photoresist film 62 is removed (FIG. 3D), a light-shielding film 64 is formed on the surface (FIG. 3E). The light-shielding film 64 is formed on the surface of the lamination structure of the second substrate 20 by a method such as sputtering, chemical vapor deposition (CVD) or evaporation.

A photoresist is applied on the light-shielding film 64 and is patterned to form a photoresist film 66 covering a pixel boundary portion where the light-shielding member 42 is to be formed (FIG. 3F). Here, the photoresist film 66 is formed so as to overlap the peripheral part of the protection film 40 on the upper surface of the color filter 14. By forming the photoresist film 66 like this, the light-shielding member 42 has a portion overlapping the peripheral part of the protection film 40. The overlapping width is determined in view of working accuracy. For example, if the edge of the pattern of the photoresist film 66 is designed to coincide with the boundary between the separation groove 48 and the upper surface of the color filter 14, the edge is liable to be positioned in the separation groove 48 by positional misalignment. As a result, a portion not covered with the light-shielding member 42 is formed on the inner surface of the separation groove 48, and the effect of suppressing the light leakage and the effect of reflection toward the forward direction are weakened. Besides, since the protection film 40 is not provided on the inner surface of the separation groove 48, if the portion not covered with the photoresist film 66 is formed on the inner surface of the separation groove 48, the color filter 14 is eroded from the separation groove 48 by the etching of the light-shielding film 64. Then, the overlap width is set to prevent the edge of the light-shielding member 42 from being positioned in the separation groove 48 by the position shift of the pattern of the photoresist film 66, retraction to the side in the etching of the light-shielding film 64, or the like.

The photoresist film 66 is used as a mask and the light-shielding film 64 is etched, so that the light-shielding member 42 having an opening in the upper surface of the color filter 14 is formed (FIG. 3G). The photoresist film 66 is removed after the light-shielding member 42 is formed.

Here, the protection film 40 functions as a stopper against the etching of the light-shielding film 64, and the color filter 14 is not eroded by the etching.

The overcoat layer 44 is formed on the surface of the lamination structure of the second substrate 20 in which the light-shielding member 42 is formed (FIG. 3H).

On the other hand, the lamination structure of the first substrate 10 is also separately formed. The first substrate 10 and the second substrate 20 on which the lamination structures are respectively formed are bonded to each other.

Figure 4:
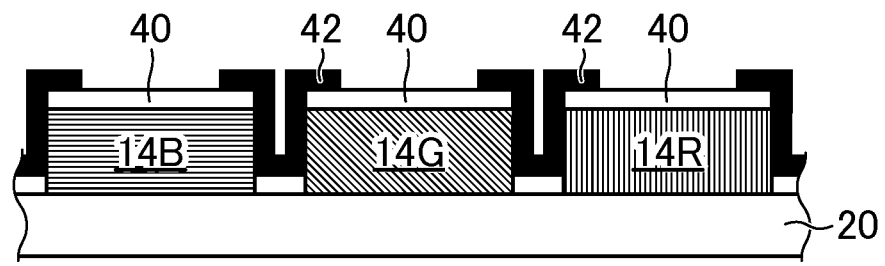
FIG. 4 is a schematic vertical sectional view of another example of the second substrate of the display device of the first embodiment of the invention.

The V-shaped separation groove 48 has the effect of preventing the light leakage into the adjacent pixel and the effect of guiding the reflected light forward at the light-shielding member 42 covering the inner surface of the separation groove 48. On the other hand, the light leakage into the adjacent pixel can be prevented also by a separation groove 48 formed to have a rectangular sectional shape as shown in FIG. 4.

Besides, the function of the protection film 40 as the etching stopper at the time of forming the light-shielding member 42 by etching the light-shielding film 64 is effective irrespective of the sectional shape of the light-shielding member 42. For example, also when the separation groove 48 is not formed at the boundary of the color filter 14 and the light-shielding member 42 is formed to be flat at the boundary, the color filter 14 can be protected against the etching of the light-shielding film 64 by providing the protection film 40.

When the width of the light-shielding member 42 in the plane shape is reduced, the area of the opening of the light-shielding member 42 can be increased. However, light leakage into the adjacent pixel becomes liable to occur. Here, the ratio of the light emitted from each organic EL element 12 to pass through the opening of the light-shielding member 42 is saturated when the area of the opening exceeds the area of the organic EL element 12. Thus, when the width of the light-shielding member 42 is narrowed, the merit of increasing the opening ratio becomes smaller as compared with the demerit. Then, for example, when the light-shielding member 42 is made to have a plane shape corresponding to a pixel separation area to separate the organic EL elements 12, the balance between the improvement of brightness by the opening ratio improvement and the suppression of light leakage into the adjacent pixel can be achieved. For example, as shown in FIG. 2, when the plane arrangements of the light-shielding member 42 and the bank 25 are adjusted, the light emitted from the light-emitting function layer 30 can be effectively used, and the incident of the light on a color filter other than a filter with a corresponding pixel color can be suppressed.

Second Embodiment

Figure 5:
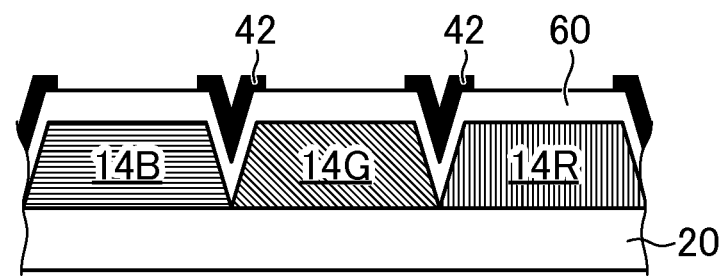
FIG. 5 is a schematic vertical sectional view of a second substrate of a display device of a second embodiment of the invention.

With respect to a second embodiment of the invention, different points from the foregoing embodiment will be mainly described. Incidentally, the same components as those of the foregoing embodiment are denoted by the same reference numerals and the description is simplified. FIG. 5 is a vertical sectional view of a second substrate of a display device 2 of this embodiment.

In the first embodiment, the protection film 60 is laminated on the color filter 14 before the separation groove 48 is formed (see FIG. 3A to 3C). On the other hand, in this embodiment, after a separation groove 48 is formed in a color filter 14, a protection film 60 is formed on the surface thereof. Thus, the protection film 60 is formed also in the inside of the separation groove 48. Then, a light-shielding film 64 is laminated on the surface of the protection film 60, and this is patterned to form a light-shielding member 42 covering the inner surface of the separation groove and a peripheral part of an upper surface of the color filter. Incidentally, in this structure, the inner surface of the separation groove at the time of laminating the light-shielding film 64 is defined by the surface of the protection film 60 covering the inner surface of the original separation groove 48.

Also in this embodiment, since the upper surface of the color filter 14 is protected by the protection film 60 in the etching of the light-shielding film 64, erosion of the color filter 14 is prevented.

Incidentally, although FIG. 5 shows the V-shaped separation groove 48, as described in the first embodiment, a rectangular separation groove 48 can also prevent light leakage between the pixels.

Third Embodiment

With respect to a third embodiment of the invention, different points from the foregoing embodiments will be mainly described. Incidentally, the same components as those of the foregoing embodiments are denoted by the same reference numerals and the description is simplified. Each of FIG. 6 and FIG. 7 is an example of a vertical sectional view of a display device 2 of this embodiment, and corresponds to the vertical sectional view of the first embodiment shown in FIG. 2.

In the first and second embodiments, the description is made on the example in which the color filters 14 have the RGB stripe arrangement. On the other hand, in this embodiment, an arrangement of pixels includes a non-filter pixel in which a color filter is not disposed on a second substrate 20. Specifically, in examples shown in FIG. 6 and FIG. 7, a pixel on the right hand side of a B filter 14B and a pixel on the left hand side of an R filter 14R are non-filter pixels. The non-filter pixel basically directly radiates white light emitted from an organic EL element 12.

Also in the display device 2 including the non-filter pixel, a light-shielding member 42 between the color filters 14 can be constructed similarly to the first embodiment and the second embodiment. On the other hand, a light-shielding member 42b at a boundary between the non-filter pixel and the pixel including the color filter 14 is formed so as to cover at least a side surface and an edge part of an upper surface of the color filter 14. Although the light-shielding member 42 and the light-shielding member 42b are different in vertical section shape, they can be made common in plane shape.

Figure 6:
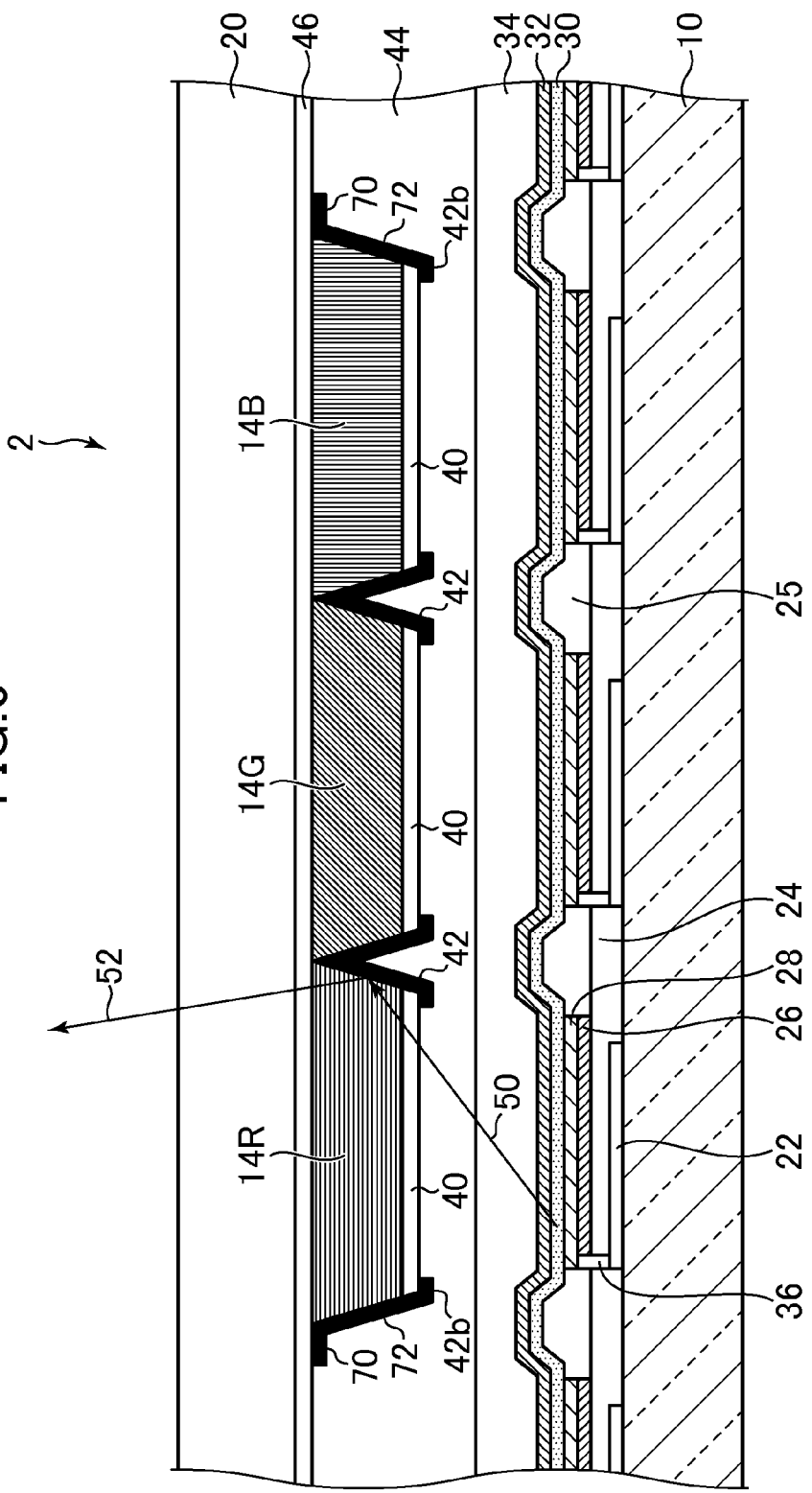
FIG. 6 is a schematic vertical sectional view of an example of a display device of a third embodiment of the invention.
Figure 7:
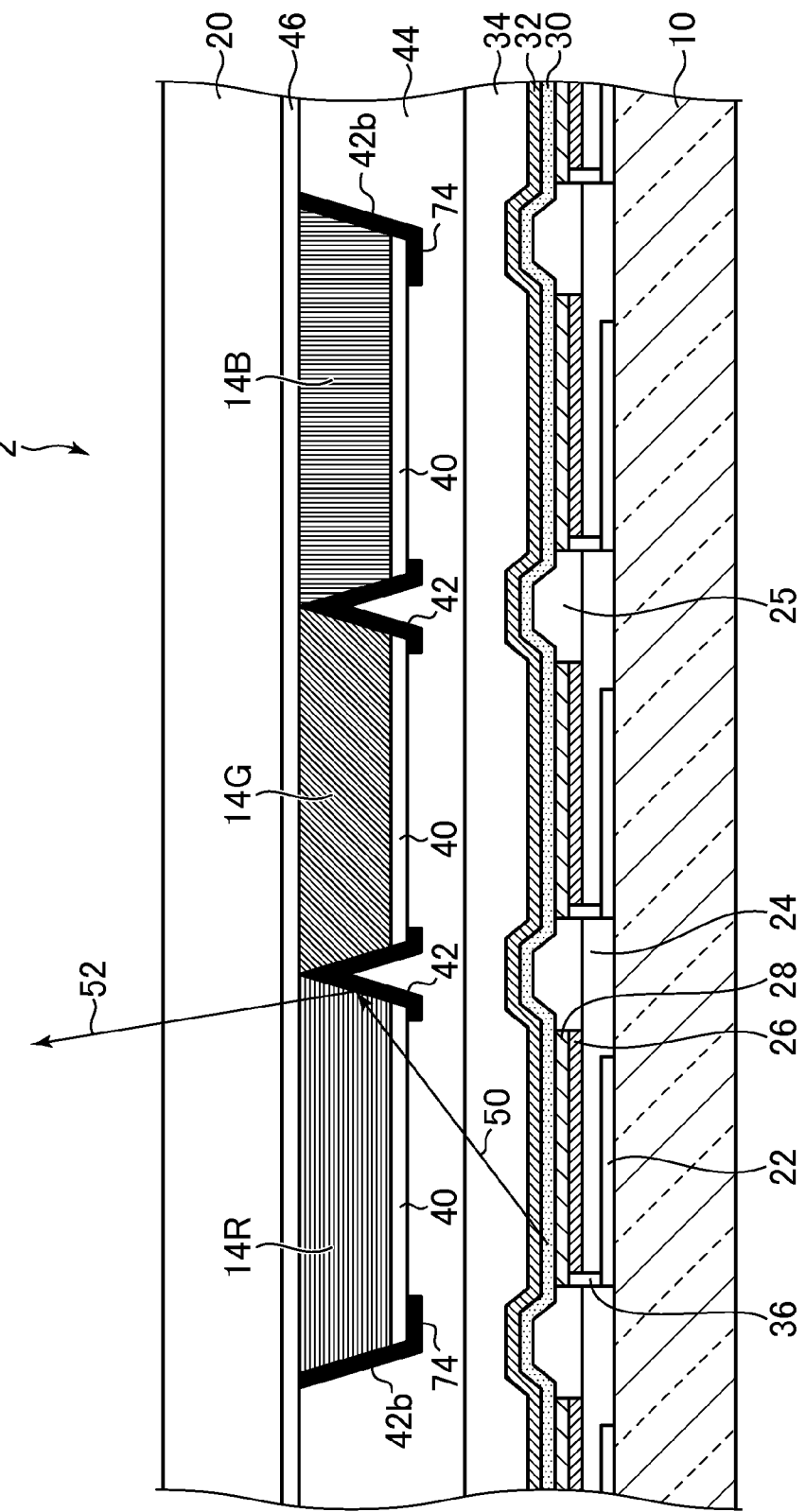
FIG. 7 is a schematic vertical sectional view of another example of the display device of the third embodiment of the invention.

For example, in the example shown in FIG. 6, the light-shielding member 42b includes a portion 70 which is provided on the non-filter pixel side and is disposed in parallel to the second substrate 20, and the width of the portion 70 is set to be the same as the width of a portion 72 in plane shape along the B filter 14B or the R filter 14R. By this, the light-shielding member 42b is formed to have the same width as the light-shielding member 42. For example, the light-shielding member 42, 42b can be made to have the plane shape corresponding to a pixel separation area to separate the organic EL elements 12.

In the example shown in FIG. 7, a B filter 14B and an R filter 14R are expanded to a pixel separation area side, and portions 74 along the upper surfaces of the filters are expanded, and the width of the light-shielding member 42b is made to be the same as the light-shielding member 42.

Fourth Embodiment

Figure 8:
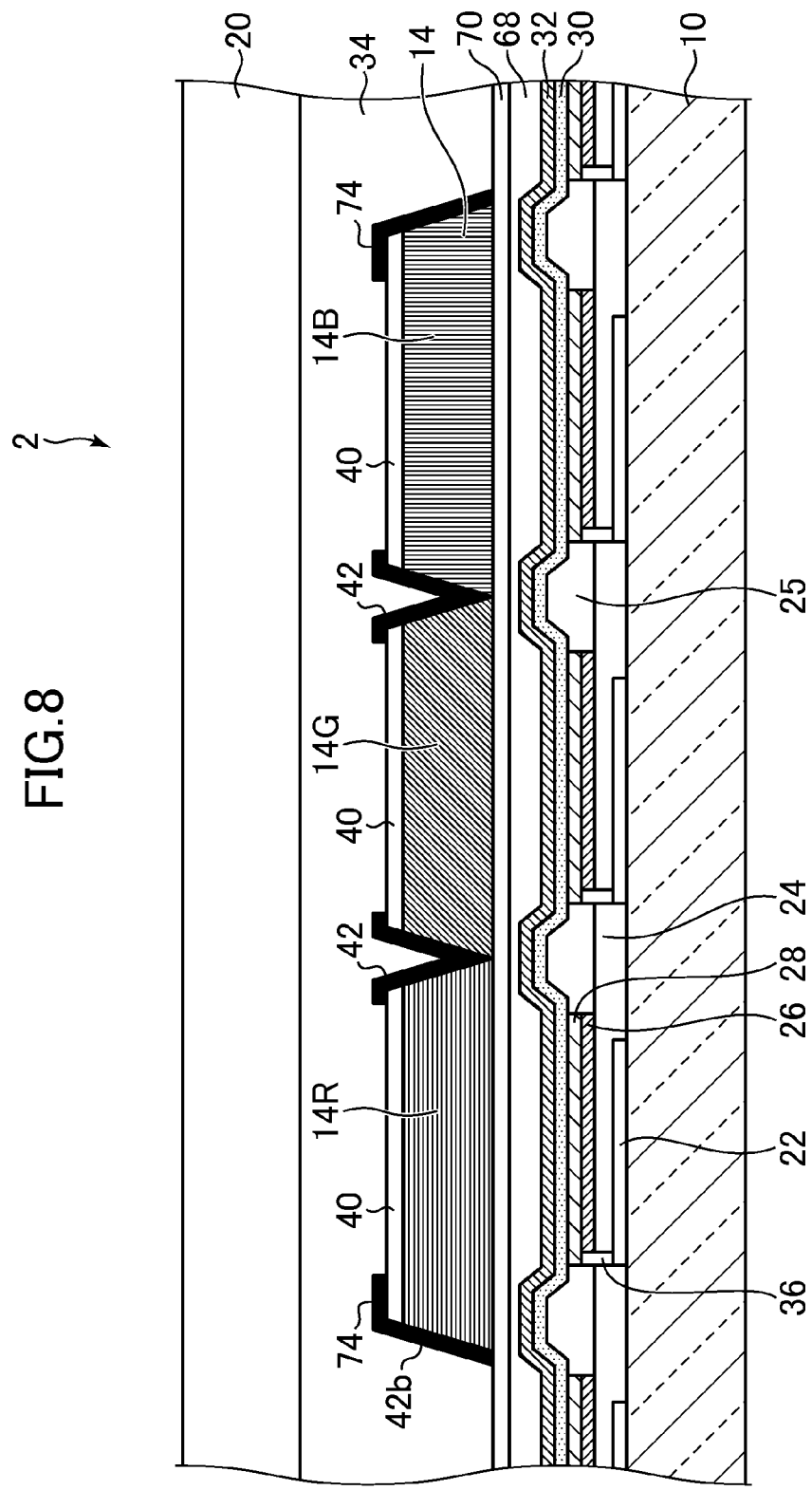
FIG. 8 is a schematic vertical sectional view of a display device of a fourth embodiment of the invention.

With respect to a fourth embodiment of the invention, different points from the foregoing embodiments will be mainly described. Incidentally, the same components as those of the foregoing embodiments are denoted by the same reference numerals and the description is simplified. FIG. 8 is a vertical sectional view of a display device 2 of this embodiment. This embodiment relates to formation of a black matrix on a color filter, and is naturally effective also for the so-called color filter on array structure in which a color filter 14 is simultaneously formed on a first substrate 10 shown in FIG. 8.

In the case of the color filter on array structure shown in FIG. 8, a pixel circuit 22 and the color filter 14 are formed on the first substrate 10. In the color filter on array structure, a distance between a light-emitting part of a light-emitting function layer 30 and the color filter 14 becomes shorter as compared with the foregoing embodiments.

A flattening film 68, a color filter under film 70 and the color filter layer 14 are sequentially formed on an opposite electrode 32 of the first substrate 10. A filler 34 is disposed on the upper part of the color filter layer 14, and a sealing substrate as a second substrate 20 is disposed thereon.

In this structure, since there is no filler between the color filter 14 and the opposite electrode 32, the distance between the light-emitting part of the light-emitting function layer 30 and the color filter 14 can be made short. As a result, the effect of suppressing light leakage into the color filter of the adjacent pixel is improved.

The display device of the invention described above can be used for an electronic equipment such as a smart phone, a portable personal computer such as a tablet PC or a note PC, a monitor of a desk-top personal computer, a television, or a car navigation system.

According to the invention described in the respective embodiments, damage of the color filter caused by erosion or the like in the process of patterning the light-shielding film is prevented, and the display device is obtained in which degradation of picture quality is prevented.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a first substrate on which a light-emitting element is disposed correspondingly to each of a plurality of pixels; and a second substrate on which a color filter is disposed correspondingly to each of the plurality of pixels and which is bonded to the first substrate, wherein the second substrate is provided with a protection film laminated on the color filter, and a light-shielding member which is laminated on the protection film and is disposed along a boundary of each of the pixels, a plurality of color filters are provided with a separation groove along the boundary of the pixels to separate the color filters, wherein the separation groove further separates the protection films along the boundary of the pixel, and the light-shielding member covers an inner surface of the separation groove and a part of an upper surface of the color filter.

2. The display device according to claim 1, wherein the light-shielding member covers the inner surface of the separation groove and a peripheral part of the upper surface of the color filter.

3. The display device according to claim 2, wherein
the protection film is selectively disposed on the upper surface of the color filter, and
the light-shielding member has an overlap with the protection film at the peripheral part.

4. The display device according to claim 2, wherein
an arrangement of the pixels includes a non-filter pixel in which the color filter is not disposed on the second substrate, and
the light-shielding member covers a side surface and an edge part of the upper surface of the color filter at a portion in contact with the non-filter pixel among the boundaries of the pixels.

5. The display device according to claim 1, wherein
the first substrate is provided with a pixel separation area to separate the plurality of light-emitting elements from each other, and
the light-shielding member has a plane shape corresponding to the pixel separation area.

6. The display device according to claim 1, wherein
the light-shielding member which is formed by patterning a light-shielding film laminated on the protection film, and
the protection film is made of a material resistant to a process of patterning the light-shielding film.

* * * * *